(12) United States Patent
Yanagisawa

(10) Patent No.: US 11,002,769 B2
(45) Date of Patent: May 11, 2021

(54) CURRENT MEASUREMENT DEVICE

(71) Applicant: CVENGINEERING CORPORATION, Sendai (JP)

(72) Inventor: Yoichi Yanagisawa, Sendai (JP)

(73) Assignee: CVENGINEERING CORPORATION, Sendai (JP)

( * ) Notice: Subject to any disclaimer, the term of this patent is extended or adjusted under 35 U.S.C. 154(b) by 0 days.

(21) Appl. No.: 16/488,400

(22) PCT Filed: Oct. 5, 2017

(86) PCT No.: PCT/JP2017/036212
§ 371 (c)(1),
(2) Date: Aug. 23, 2019

(87) PCT Pub. No.: WO2018/163487
PCT Pub. Date: Sep. 13, 2018

(65) Prior Publication Data
US 2019/0377010 A1 Dec. 12, 2019

(30) Foreign Application Priority Data
Mar. 6, 2017 (JP) .............................. JP2017-042140

(51) Int. Cl.
*G01R 19/165* (2006.01)
*G01R 1/22* (2006.01)
(Continued)

(52) U.S. Cl.
CPC ......... *G01R 19/16504* (2013.01); *G01R 1/22* (2013.01); *G01R 15/20* (2013.01); *G01R 19/0092* (2013.01); *G01R 33/07* (2013.01)

(58) Field of Classification Search
CPC .......... G01R 19/16504; G01R 19/0092; G01R 15/20; G01R 15/207; G01R 33/07; G01R 33/072
See application file for complete search history.

(56) References Cited

U.S. PATENT DOCUMENTS 6,586,923 B2 * 7/2003 Seike ................... G01R 15/202
324/117 H
6,646,562 B1 * 11/2003 Chang .................... G01R 15/12
324/115
(Continued)

FOREIGN PATENT DOCUMENTS

CN 103675403 A 3/2014
CN 105044423 A 11/2015
(Continued)

OTHER PUBLICATIONS

Dec. 26, 2017 International Search Report issued in International Patent Application No. PCT/JP2017/036212.
(Continued)

*Primary Examiner* — Dominic E Hawkins
(74) *Attorney, Agent, or Firm* — Oliff PLC

(57) ABSTRACT

A pair of clamping parts clamp a conductor to be measured and biased in closing directions. A pair of gripping parts are provided to be able to change a distance between the respective clamping parts according to a distance therebetween. Magnetoelectric conversion element(s) for current measurement is/are provided on either one or both of the respective clamping parts. A distance measurement unit is provided to be able to measure a physical quantity corresponding to the distance between the respective gripping parts as a physical quantity corresponding to the distance between the respective clamping parts. A current calculation device is provided to obtain a current flowing in the conductor to be measured on the basis of a magnetic field detected by the magnetoelectric conversion element(s) for current measurement and the physical quantity measured by the distance measurement unit when the conductor to be measured is clamped by the respective clamping parts.

6 Claims, 5 Drawing Sheets

(51) Int. Cl.
    *G01R 15/20*     (2006.01)
    *G01R 19/00*     (2006.01)
    *G01R 33/07*     (2006.01)

(56) References Cited

U.S. PATENT DOCUMENTS

| | | | |
|---|---|---|---|
| 8,922,195 B2* | 12/2014 | Worones | G01R 1/22 |
| | | | 324/127 |
| 10,281,503 B2* | 5/2019 | Steuer | G01R 15/14 |
| 2011/0316523 A1 | 12/2011 | Ko et al. | |
| 2014/0035607 A1* | 2/2014 | Heydron | G01R 1/04 |
| | | | 324/754.02 |
| 2014/0062459 A1* | 3/2014 | El-Essawy | G01R 15/205 |
| | | | 324/117 R |
| 2016/0047846 A1* | 2/2016 | Sharma | G01R 15/205 |
| | | | 324/251 |

FOREIGN PATENT DOCUMENTS

| | | |
|---|---|---|
| JP | S50-086163 U | 7/1975 |
| JP | H04-233470 A | 8/1992 |
| JP | 2000-180475 A | 6/2000 |
| JP | 2002-005967 A | 1/2002 |
| JP | 2004-325273 A | 11/2004 |
| JP | 2010-122150 A | 6/2010 |
| JP | 2012-185176 A | 9/2012 |
| JP | 2014-238386 A | 12/2014 |

OTHER PUBLICATIONS

Jan. 5, 2021 Office Action issued in Chinese Patent Application No. 201780087941.5.

* cited by examiner (a)

(b)

CURRENT MEASUREMENT DEVICE

FIELD OF THE INVENTION

The present invention relates to a current measurement device.

DESCRIPTION OF RELATED ART

Conventionally, a clamp-type current sensor including a C-type magnetic core and magnetoelectric conversion elements such as Hall elements arranged across an opening of the magnetic core and configured to capture a magnetic field generated by a current flowing in a conductor to be measured arranged inside the magnetic core by the magnetic core and detect and measure a magnetic field strength on an end surface of the magnetic core by the magnetoelectric conversion elements is known as a device for measuring a current flowing in a conductor in a non-contact manner (see, for example, Patent Literature 1 and 2).

Further, a U-shaped current sensor is also known which is configured by mounting magnetoelectric conversion elements respectively on both end surfaces of an opening of a C-type magnetic core with the opening set open and conducts a measurement by inserting a conductor to be measured into the inside of the magnetic core through the opening (see, for example, Patent Literature 3).

CITATION LIST

Patent Literature 1: JP-A-2010-122150
Patent Literature 2: JP-A-2000-180475
Patent Literature 3: JP-A-2002-5967

SUMMARY OF THE INVENTION

In the case of measuring a current of each wiring in a switchboard or the like in which complicated wirings are housed in a wiring duct, with the clamp-type current sensors described in Patent Literature 1 and 2, the wiring to be measured (conductor to be measured) needs to be pulled out to a certain extent to be arranged inside the magnetic core after the wiring to be measured is searched out from the duct. Thus, the problem has been that a measurement operation of each wiring becomes cumbersome. Further, with the U-shaped current sensor described in Patent Literature 3, the wirings have to be pressed to a backmost part inside the magnetic core to measure a current with a predetermined accuracy. After all, the wiring to be measured (conductor to be measured) has to be pulled out to a certain extent, which has presented a problem that a measurement operation of each wiring becomes cumbersome.

The present invention has been made focusing on those problems. It is an object of the present invention to provide a current measurement device capable of reducing or dispensing with an operation of pulling out a conductor to be measured from a wiring duct or the like and capable of easily proceeding with a current measurement operation.

To attain the above object, a current measurement device according to the present invention includes a pair of clamping parts provided to clamp a conductor to be measured, magnetoelectric conversion element(s) for current measurement provided on either one or both of the respective clamping parts, a distance measurement unit provided to be able to measure a physical quantity corresponding to a distance between the respective clamping parts, and a current calculation means provided to obtain a current flowing in the conductor to be measured on the basis of a magnetic field detected by the magnetoelectric conversion element(s) for current measurement and the physical quantity measured by the distance measurement unit when the conductor to be measured is clamped by the respective clamping parts.

The current measurement device according to the present invention can measure the current flowing in the conductor to be measured by clamping the conductor to be measured by the respective clamping parts. The current measurement device according to the present invention can detect the magnetic field generated by the current flowing in the conductor to be measured by the magnetoelectric conversion element(s) for current measurement provided on either one or both of the respective clamping parts when the conductor to be measured is clamped by the respective clamping parts. However, since a thickness of the conductor and a thickness of a coating differ in the conductor to be measured coated like a wire, which is a usual object to be measured, a distance between the conductor to be measured and the magnetoelectric conversion element for current measurement changes according to the thickness of the conductor and the thickness of the coating. Due to this distance change, the strength of the detected magnetic field changes. Accordingly, the current measurement device according to the present invention can accurately obtain the current flowing in the conductor to be measured by measuring a physical quantity corresponding to the distance between the respective clamping parts by the distance measurement unit since the distance between the conductor to be measured and the magnetoelectric conversion element is thought to be correlated with the distance between the respective clamping parts, and by correcting a current value or the like obtained from the magnetic field detected by the magnetoelectric conversion element(s) for current measurement on the basis of the physical quantity by the current calculation means.

The current measurement device according to the present invention can measure the current flowing in the conductor to be measured only by clamping the conductor to be measured by the respective clamping parts. Thus, for example, in the case of measuring a current of each wiring housed in a wiring duct or the like of a switchboard, the wiring needs not be pulled out from the wiring duct or the like as much as when a conventional clamp-type current sensor or U-shaped current sensor is used. As just described, the current measurement device according to the present invention can reduce or dispense with an operation of pulling out the conductor to be measured from the wiring duct or the like and can easily proceed with a current measurement operation. Further, it is also not necessary to secure a space for pulling out the conductor to be measured.

In the current measurement device according to the present invention, the magnetoelectric conversion element for current measurement is, for example, constituted by a Hall element. Further, the magnetoelectric conversion element for current measurement may be provided on either one of the respective clamping parts, but the magnetoelectric conversion elements for current measurement are preferably provided on the both clamping parts to suppress the influence of currents flowing in conductors adjacent to the conductor to be measured.

Preferably, the current measurement device according to the present invention includes a pair of gripping parts provided to be able to change the distance between the respective clamping parts according to a distance therebetween, the respective clamping parts are biased in closing directions, and the distance measurement unit is provided to be able to measure a physical quantity corresponding to the distance between the respective gripping parts as the physical quantity. In this case, since there is a correlation between the distance between the respective gripping parts and the distance between the respective clamping parts, the physical quantity corresponding to the distance between the respective gripping parts can be measured as the physical quantity corresponding to the distance between the respective clamping parts. By measuring the physical quantity corresponding to the distance between the respective gripping parts, that measurement can be prevented from adversely affecting a current measurement at the respective clamping parts. Since the respective clamping parts are biased in the closing directions, the conductor to be measured can be firmly clamped by the respective clamping parts at the time of measurement. The respective clamping parts and the respective gripping parts may be, for example, constituted by a tip part and an operating part of a clamping clip configured to clamp an object by the tip part.

In the current measurement device according to the present invention, the distance measurement unit may have any configuration if the physical quantity corresponding to the distance between the respective clamping parts or the respective gripping parts can be measured. The distance measurement unit may, for example, include a magnet provided on one gripping part and a magnetoelectric conversion element for distance measurement provided on the other gripping part to be able to detect a magnetic field due to the magnet or may be constituted by a mechanical distance measurement unit in which a potentiometer is coupled to a gear. In the case of the configuration including the magnet and the magnetoelectric conversion element for distance measurement, the physical quantity corresponding to the distance between the respective gripping parts can be easily measured by a particularly simple configuration. Further, since the magnet is provided on the gripping part, the influence of a magnetic field of the magnet given to the magnetoelectric conversion element(s) for current measurement provided on the clamping parts can be mostly ignored.

In the current measurement device according to the present invention, the current calculation means may be configured to obtain the current flowing in the conductor to be measured, for example, by correcting a current value obtained on the basis of the magnetic field detected by the magnetoelectric conversion element(s) for current measurement by a correction value obtained on the basis of the physical quantity measured by the distance measurement unit.

The present invention can provide a current measurement device capable of reducing or dispensing with an operation of pulling out a conductor to be measured from a wiring duct or the like and capable of easily proceeding with a current measurement operation.

DETAILED DESCRIPTION OF THE INVENTION

Hereinafter, an embodiment of the present invention is described on the basis of the drawings.

FIGS. 1 to 7 show a current measurement device 10 of the embodiment of the present invention.

Figure 1:
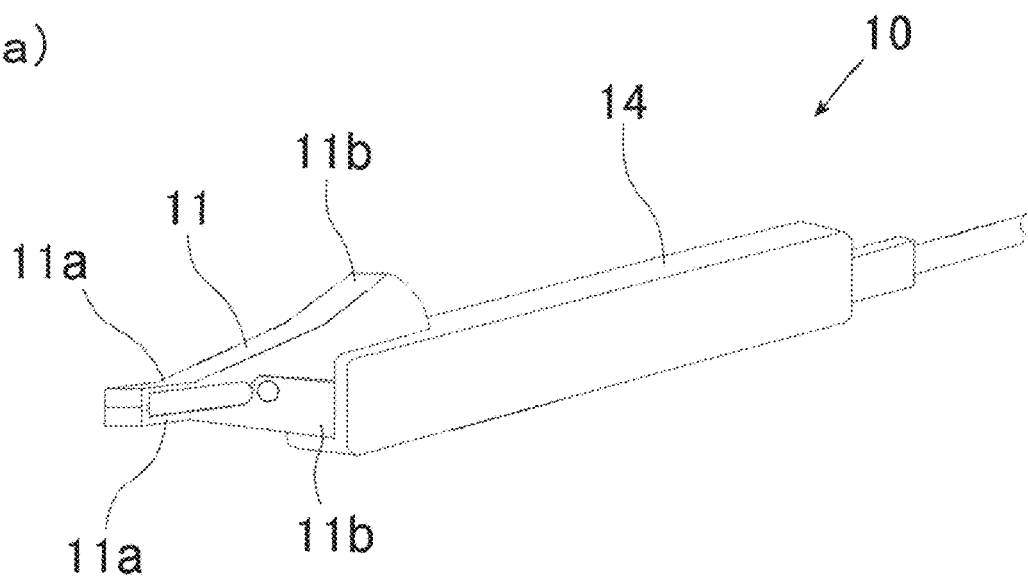
FIG. 1(a) is a perspective view showing a current measurement device of an embodiment of the present invention and FIG. 1(b) is a side view in section showing an internal structure of a measurement clip.
Figure 1:
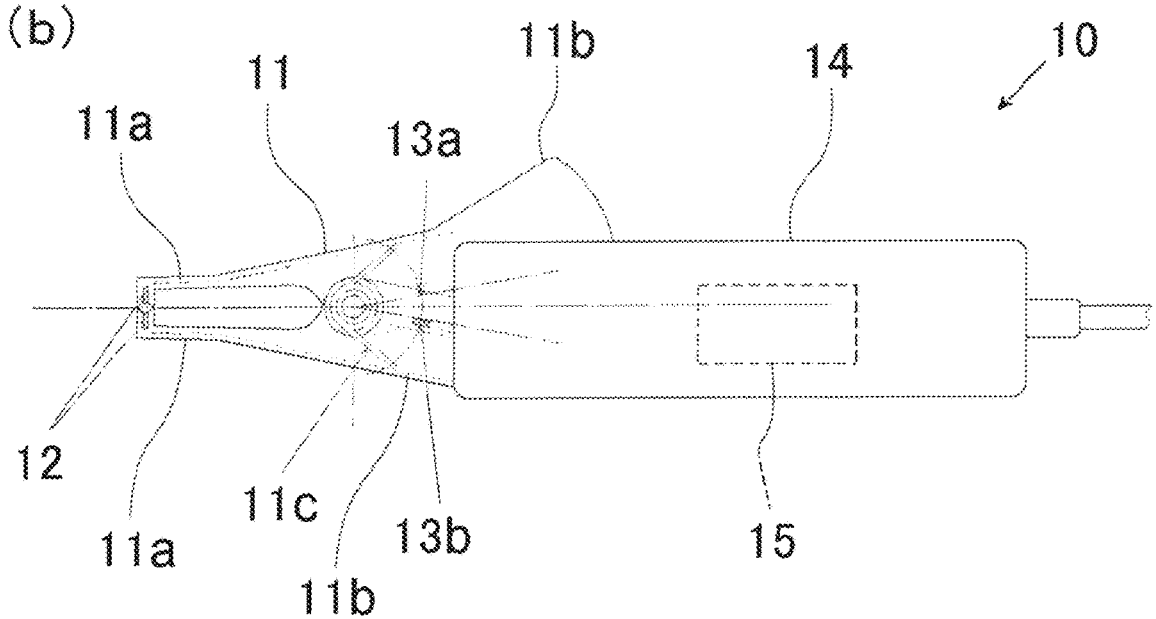

As shown in FIG. 1, the current measurement device 10 includes a measurement clip 11, a pair of magnetoelectric conversion elements 12 for current measurement, a distance measurement unit 13, a casing 14 and a current calculation means 15.

The measurement clip 11 is constituted by a clamping clip including a pair of clamping parts 11a on a tip side and a pair of gripping parts 11b on a rear end side and configured to clamp a conductor to be measured between the respective clamping parts 11a. The measurement clip 11 is biased in a direction to open the respective gripping parts 11b by a torsion coil spring 11c, whereby the respective clamping parts 11a are biased in closing directions. The measurement clip 11 is configured such that the respective clamping parts 11a are opened by gripping and moving the respective gripping parts 11b in closing directions against a biasing force of the torsion coil spring 11c. In the measurement clip 11, a distance between the respective clamping parts 11a can be changed according to a distance between the respective gripping parts 11b.

Figure 2:
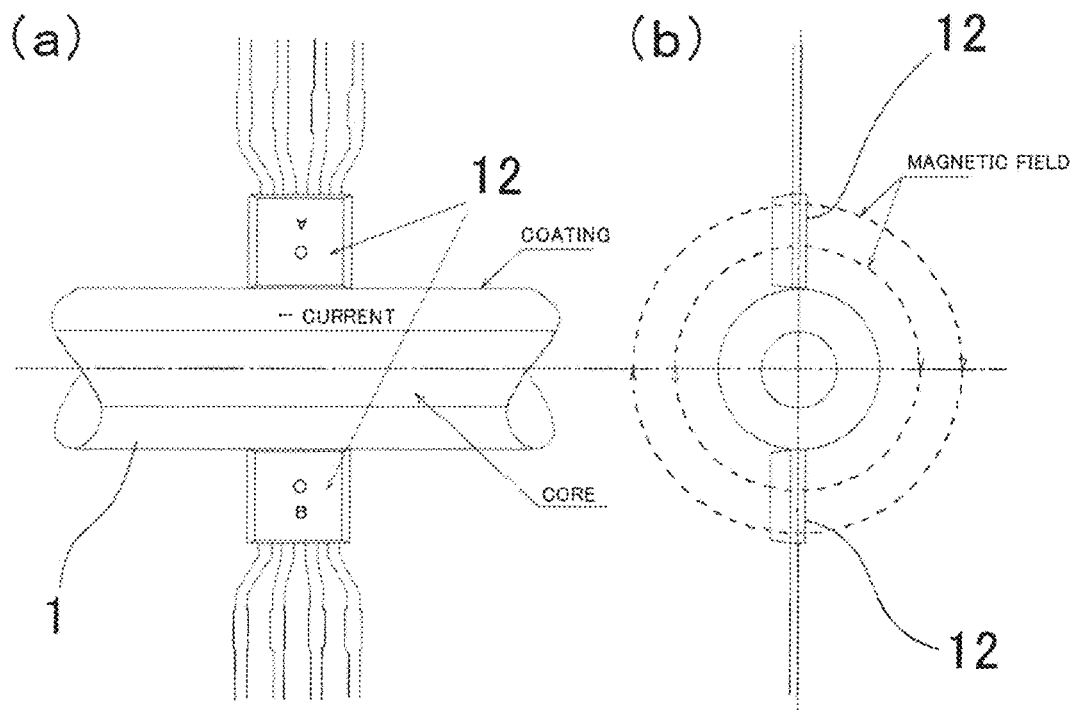
FIGS. 2(a) and 2(b) are a front view and a side view showing a used state of each magnetoelectric conversion element for current measurement of the current measurement device shown in FIG. 1 at the time of measurement.

Each magnetoelectric conversion element 12 for current measurement is constituted by a Hall element and attached to the tip of each clamping part 11a. As shown in FIG. 2, each magnetoelectric conversion element 12 for current measurement can detect a magnetic field generated by a current flowing in a conductor to be measured 1 when the conductor to be measured 1 is clamped between the tips of the respective clamping parts 11a.

As shown in FIG. 1(b), the distance measurement unit 13 includes a permanent magnet 13a provided on one gripping part 11b and a magnetoelectric conversion element 13b for distance measurement provided on the other gripping part 11b. The permanent magnet 13a and the magnetoelectric conversion element 13b for distance measurement are attached at positions facing each other on inner sides of the respective gripping parts 11b. The magnetoelectric conversion element 13b for distance measurement is constituted by a Hall element and provided to be able to detect a magnetic field due to the permanent magnet 13a. The distance measurement unit 13 can measure a physical quantity corresponding to the distance between the respective gripping parts 11b, i.e. a physical quantity corresponding to the distance between the respective clamping parts 11a correlated with the distance between the gripping parts 11b by detecting a change of a distance to the permanent magnet 13a by the magnetoelectric conversion element 13b for distance measurement when the distance between the respective gripping parts 11b changes.

As shown in FIG. 1, the casing 14 is constituted by an elongated rectangular box body and has one end part mounted on a rear end side of the measurement clip 11. The current measurement device 10 is configured such that the respective gripping parts 11b of the measurement clip 11 are operable in a state where the casing 14 is gripped.

The current calculation means 15 is constituted by a computer and built in the casing 14. The current calculation means 15 is electrically connected to each magnetoelectric conversion element 12 for current measurement and the magnetoelectric conversion element 13b for distance measurement to be able to receive signals from these elements. The current calculation means 15 is configured to obtain a current flowing in the conductor to be measured 1 on the basis of the magnetic field detected by each magnetoelectric conversion element 12 for current measurement and the physical quantity corresponding to the distance between the respective clamping parts 11a measured by the distance measurement unit 13 when the conductor to be measured 1 is clamped by the respective clamping parts 11a.

It should be noted that the current measurement device 10 may include a display means for displaying a current value obtained by the current calculation means 15 on a side surface of the casing 14.

Next, functions are described.

The current measurement device 10 can measure the current flowing in the conductor to be measured 1 by clamping the conductor to be measured 1 by the respective clamping parts 11a. The current measurement device 10 can detect the magnetic field generated by the current flowing in the conductor to be measured 1 by the magnetoelectric conversion elements 12 for current measurement respectively provided on the clamping parts 11a when the conductor to be measured 1 is clamped by the respective clamping parts 11a. However, since a thickness of the conductor and a thickness of a coating differ in the conductor to be measured 1 coated like a wire, which is a usual object to be measured, at this time, a distance between the conductor to be measured 1 and each magnetoelectric conversion element 12 for current measurement changes according to the thickness of the conductor and the thickness of the coating. Due to this distance change, the strength of the detected magnetic field changes. Accordingly, the current measurement device 10 measures the physical quantity corresponding to the distance between the respective clamping parts 11a, which changes according to the thicknesses of the coating and the like of the conductor to be measured 1, by the distance measurement unit 13. Further, the current measurement device 10 corrects a current value or the like obtained from the magnetic field detected by each magnetoelectric conversion element 12 for current measurement on the basis of the measured physical quantity by the current calculation means 15. In this way, the current measurement device 10 can accurately obtain the current flowing in the conductor to be measured 1.

The current measurement device 10 can measure the current flowing in the conductor to be measured 1 only by clamping the conductor to be measured 1 by the respective clamping parts 11a. Thus, for example, in the case of measuring a current of each wiring housed in a wiring duct or the like of a switchboard as the conductor to be measured 1, the wiring needs not be pulled out from the wiring duct as much as when a conventional clamp-type current sensor or U-shaped current sensor is used. As just described, the current measurement device 10 can reduce or dispense with an operation of pulling out the conductor to be measured 1 from the wiring duct or the like and can easily proceed with a current measurement operation. Further, it is also not necessary to secure a space for pulling out the conductor to be measured 1. The current measurement device 10 is effective particularly in measuring a current of a wire connected to a terminal block. Further, since a current measurement in the terminal block of the switchboard is possible, it is also easy to specify the wire to be measured.

The current measurement device 10 can suppress the influence of currents flowing in conductors adjacent to the conductor to be measured 1, for example, even if conductors are densely arranged since the magnetoelectric conversion elements 12 for current measurement are provided on the both clamping parts 11a. Further, the current measurement device 10 can prevent the permanent magnet 13a from affecting the detection of the magnetic field due to the conductor to be measured 1 by each magnetoelectric conversion element 12 for current measurement and prevent the magnetic field due to the conductor to be measured 1 from affecting the detection of the magnetic field of the permanent magnet 13a by the magnetoelectric conversion element 13b for distance measurement since the permanent magnet 13a and the magnetoelectric conversion element 13b for distance measurement of the distance measurement unit 13 are provided on the respective gripping parts 11b. Further, the current measurement device 10 can firmly clamp the conductor to be measured 1 by the respective clamping parts 11a at the time of measurement since the respective clamping parts 11a are biased in the closing directions by the torsion coil spring 11c.

Example 1

A test was conducted to carry out a measurement by the measurement clip 11 and the distance measurement unit 13 of the current measurement device 10 and examine a correction effect by the distance measurement unit 13 for a current value measured by the measurement clip 11. It should be noted that since the test is for the confirmation of measurement accuracy and the like, data is measured by a simple configuration using an amplifier and a data logger without providing the current calculation means 15 and the obtained data is analyzed by a spreadsheet software of a personal computer.

Figure 3:
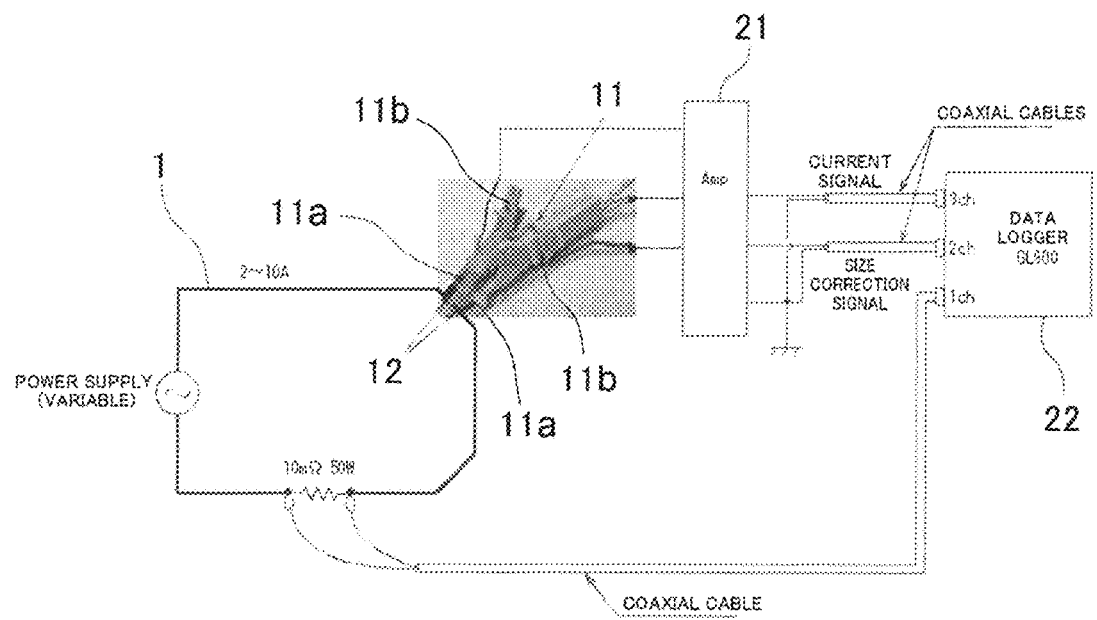
FIG. 3 is a block diagram showing the configuration of a testing apparatus for a test of examining a correction effect by a distance measurement unit of the current measurement device shown in FIG. 1.
Figure 4:
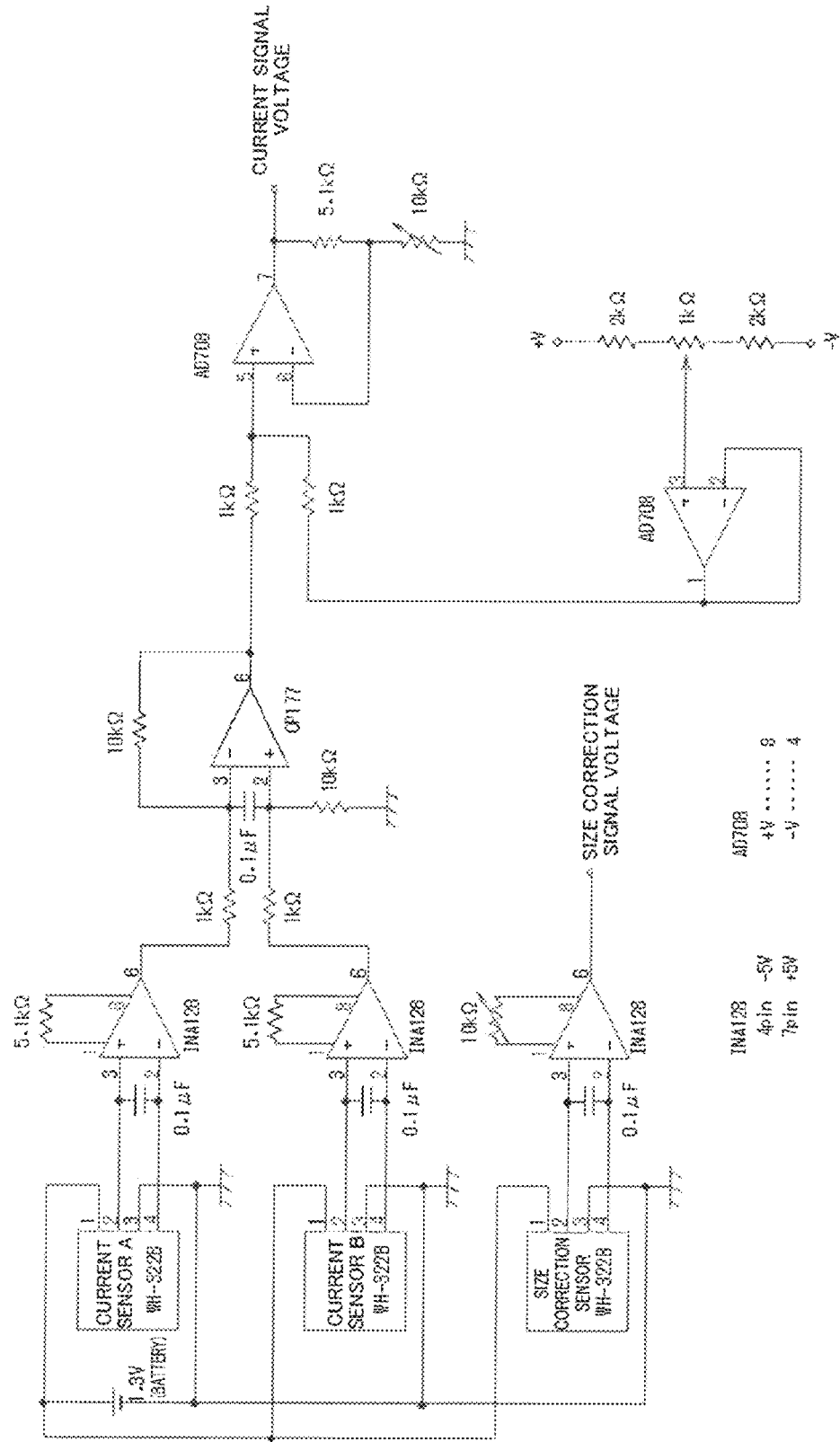
FIG. 4 is a circuit diagram of an amplifier (Amp) of the testing apparatus shown in FIG. 3.

In the test, the conductor to be measured 1 in which a current flowed was measured by being clamped by the respective clamping parts 11a of the measurement clip 11 as shown in FIG. 3. At this time, after a measurement signal (voltage value) by the measurement clip 11 and a measurement signal (voltage value) by the distance measurement unit 13 are amplified by an amplifier (Amp) 21, these signals are sent respectively as a current signal voltage and a size correction signal voltage to a data logger 22 and saved in the form of digital data. A circuit diagram of the amplifier 21 is shown in FIG. 4. Further, the current flowing in the conductor to be measured 1 was directly measured by the data logger 22 and saved as an energizing current in the form of digital data.

In the test, the current flowing in the conductor to be measured 1 was a direct current and changed in a range of 2 to 10 A. Further, a sampling interval of the data logger 22 was set at 1 msec. In the test, six types of wires Nos. 1 to 6 shown in Table 1 were used as the conductors to be measured 1.

TABLE 1

| No. | Type | Size (mm²) | No. | Type | Size (mm²) |
|---|---|---|---|---|---|
| 1 | KIV | 1.25 | 5 | KIV | 5.5 |
| 2 | KIV | 2 | 6 | KIV | 8 |
| 3 | KIV | 3.5 | | | |
| 4 | 3PNCT (1 Core) | | | | 5.5 |

Figure 5:
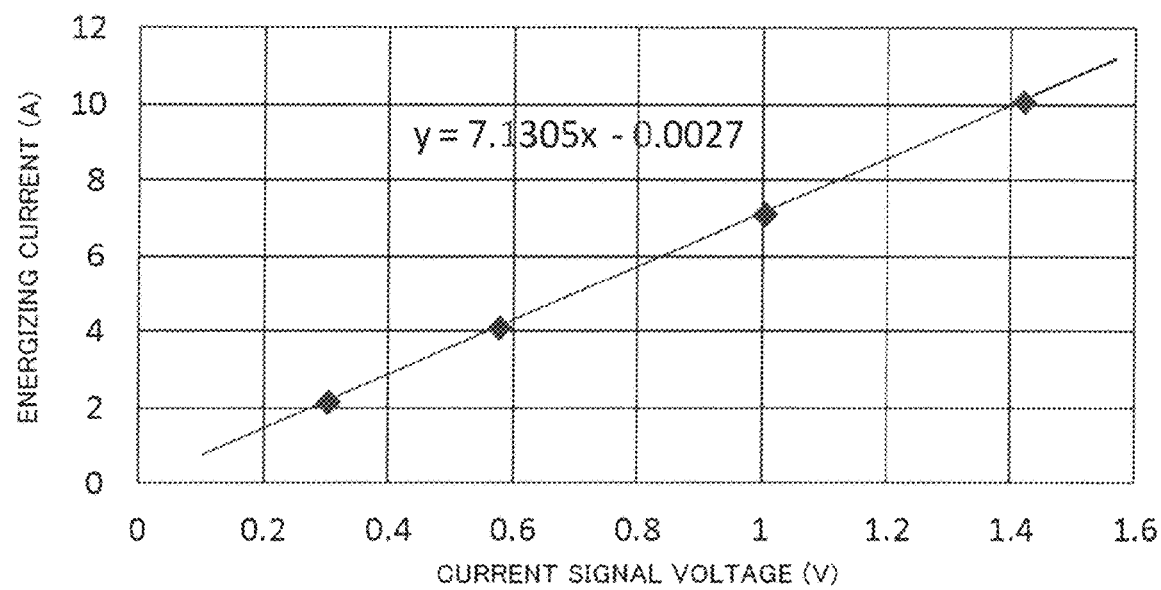
FIG. 5 is a graph showing a relationship between an energizing current and a current signal voltage measured by a measurement clip, which relationship was obtained in the test by the testing apparatus shown in FIG. 3.

First, for the wire No. 3 (KIV, 3.5 mm²), a relationship between the energizing current and the current signal voltage measured by the measurement clip 11 was obtained. This relationship is shown in FIG. 5. As shown in FIG. 5, the relationship between the energizing current and the current signal voltage was expressed by a straight line, whereby it was confirmed that the linearity of the magnetoelectric conversion elements 12 for current measurement constituted by Hall elements was good. In the case of FIG. 5, a regression line when x denotes the current signal voltage and y denotes the energizing current is:

$$y = 7.1305x - 0.0027 \quad (1).$$

Figure 6:
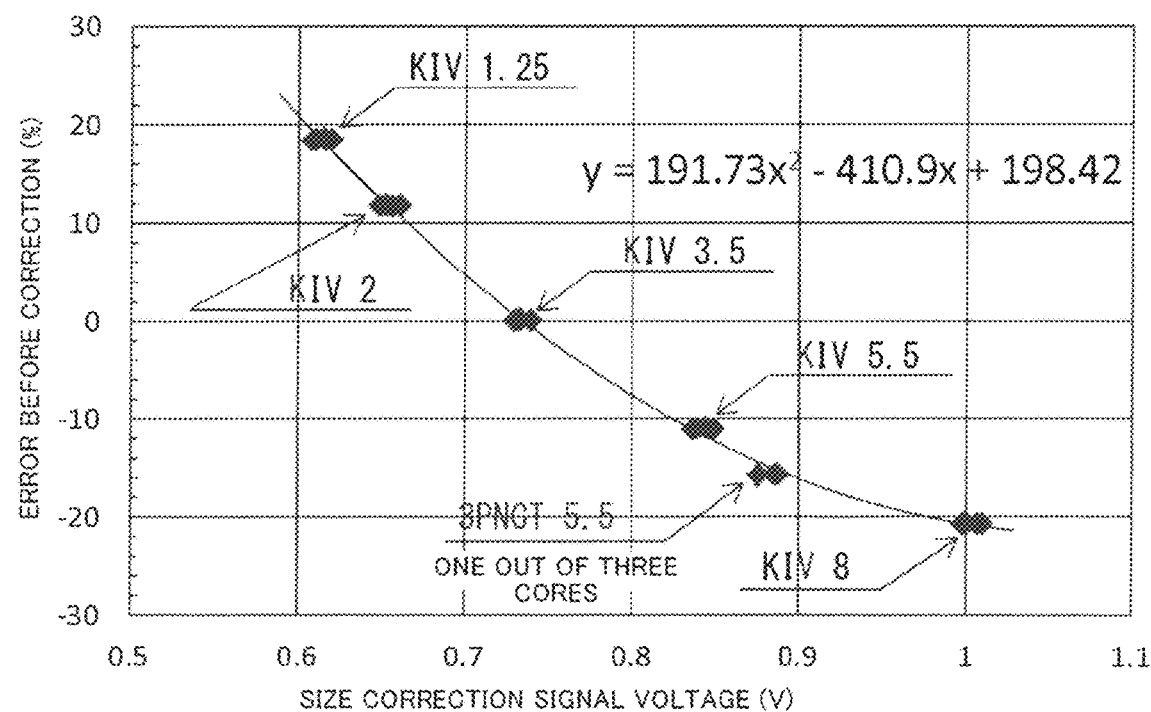
FIG. 6 is a graph showing a relationship between an error before correction and a size correction signal voltage of each conductor to be measured measured by the distance measurement unit, which relationship was obtained in the test by the testing apparatus shown in FIG. 3.

Subsequently, for the wires Nos. 1 to 6, the current signal voltage x measured at each energizing current was converted into a current value using Equation (1) and an error (error before correction) of that conversion current with respect to the energizing current was obtained. A relationship between the obtained error and the size correction signal voltage of each wire No. 1 to 6 measured by the distance measurement unit 13 was obtained. This relationship is shown in FIG. 6. As shown in FIG. 6, an error within the range of about ±20% was confirmed between the conversion current and the energizing current. In the case of FIG. 6, a regression curve when X denotes the size correction signal voltage and Y (ratio) denotes the error is:

$$Y = 1.9173X^2 - 4.109X + 1.9842 \quad (2).$$

The following Equation (3) is obtained as an equation for calculating a current I flowing in the conductor to be measured 1 from Equations (1) and (2). In this Equation (3), the current I is calculated by correcting the conversion current obtained from the current signal voltage x using the size correction signal voltage X.

Equation 1

$$I = \frac{7.1305x - 0.0027}{1 - (1.9173X^2 - 4.109X + 1.9842)} \quad (3)$$

Figure 7:
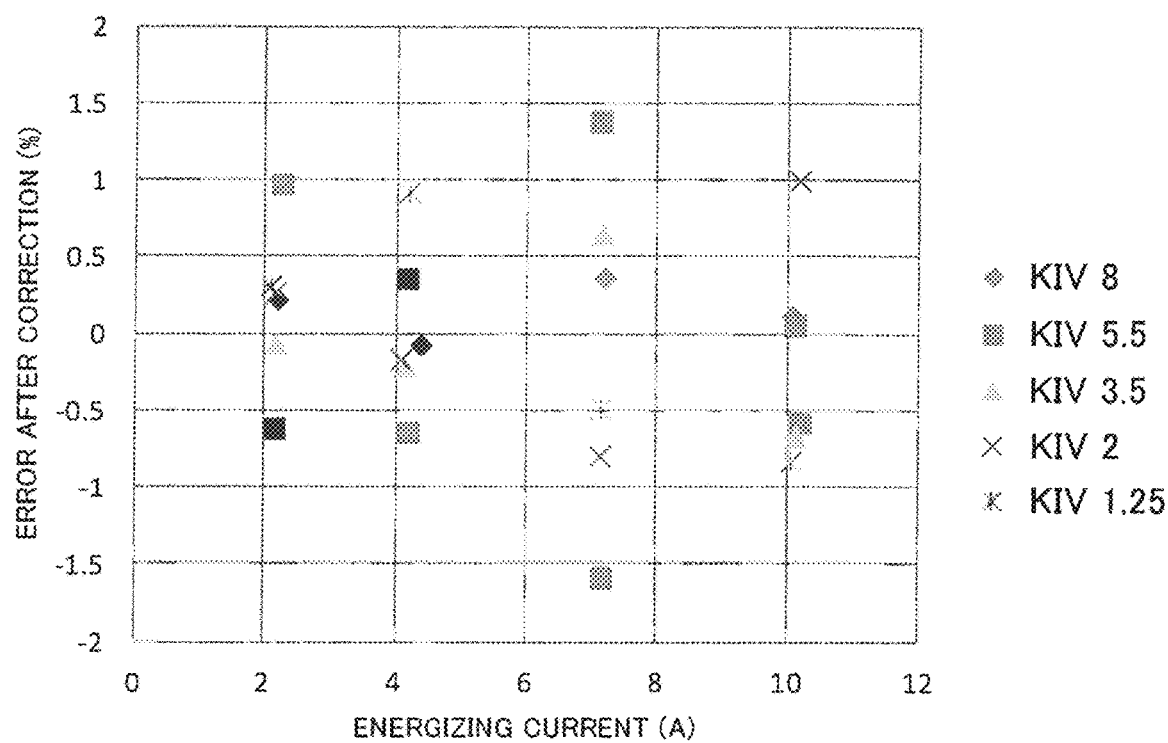
FIG. 7 is a graph showing a relationship between an error after correction and the energizing current, which relationship was obtained in the test by the testing apparatus shown in FIG. 3.

For the wires Nos. 1 to 3, 5 and 6, the current I was obtained from the current signal voltage x measured at each energizing current using Equation (3) and an error (error after correction) of that current I with respect to the energizing current was obtained. These errors are shown in FIG. 7. As shown in FIG. 7, it was confirmed that the error between the obtained current I and the energizing current was within the range of ±2%. From this, it can be said that the current measurement device 10 can accurately obtain the current flowing in the conductor to be measured 1.

It should be noted that although the amplifier 21 and the data logger 22 were separately provided to examine the correction effect by the distance measurement unit 13 in this test, the current measurement device 10 can be configured by incorporating functions of these devices and a function of the calculation by Equation (3) into the current calculation means 15. Further, since the form, coefficients and the like of Equation (3) change depending on members and the like used, the highly accurate current measurement device 10 can be configured by obtaining a calculation formula similar to Equation (3) in advance and incorporating the calculation formula into the current calculation means 15.

REFERENCE SIGNS LIST

1: conductor to be measured
10: current measurement device
11: measurement clip
　11a: clamping part
　11b: gripping part
　11c: torsion coil spring
12: magnetoelectric conversion element for current measurement
13: distance measurement unit
　13a: permanent magnet
　13b: magnetoelectric conversion element for distance measurement
14: casing
15: current calculation means
21: amplifier
22: data logger

What is claimed is:

1. A current measurement device, comprising:
a pair of clamping parts provided to clamp a conductor to be measured;
magnetoelectric conversion element(s) for current measurement provided on either one or both of the respective clamping parts;
a distance measurement unit provided to be able to measure a physical quantity corresponding to a distance between the respective clamping parts when the conductor to be measured is clamped by the pair of clamping parts; and
a current calculation means that is electrically connected to the magnetoelectric conversion element(s) and the distance measurement unit and is provided to obtain a current flowing in the conductor to be measured on the basis of a magnetic field detected by the magnetoelectric conversion element(s) for current measurement and the physical quantity measured by the distance measurement unit when the conductor to be measured is clamped by the respective clamping parts.

2. The current measurement device according to claim 1, comprising
a pair of gripping parts provided to be able to change the distance between the respective clamping parts according to a distance therebetween, wherein:
the respective clamping parts are biased in closing directions; and
the distance measurement unit is provided to be able to measure a physical quantity corresponding to the distance between the respective gripping parts as the physical quantity.

3. The current measurement device according to claim 2, wherein the distance measurement unit includes a magnet provided on one gripping part and a magnetoelectric conversion element for distance measurement provided on the other gripping part to be able to detect a magnetic field due to the magnet.

4. The current measurement device according to claim 1, wherein the current calculation means is configured to obtain the current flowing in the conductor to be measured by correcting a current value obtained on the basis of the magnetic field detected by the magnetoelectric conversion element(s) for current measurement by a correction value obtained on the basis of the physical quantity measured by the distance measurement unit.

5. The current measurement device according to claim 2, wherein the current calculation means is configured to obtain the current flowing in the conductor to be measured by correcting a current value obtained on the basis of the magnetic field detected by the magnetoelectric conversion element(s) for current measurement by a correction value obtained on the basis of the physical quantity measured by the distance measurement unit.

6. The current measurement device according to claim 3, wherein the current calculation means is configured to obtain the current flowing in the conductor to be measured by correcting a current value obtained on the basis of the magnetic field detected by the magnetoelectric conversion element(s) for current measurement by a correction value obtained on the basis of the physical quantity measured by the distance measurement unit.

\* \* \* \* \*